US012635543B2

(12) United States Patent
Li et al.

(10) Patent No.: US 12,635,543 B2
(45) Date of Patent: May 19, 2026

(54) COMPACT BALL GRID ARRAY PACKAGE FOR USE IN TOUCH PANEL CONTROLLER AND TOUCH PANEL DEVICE UTILIZING THE SAME

(71) Applicant: NOVATEK Microelectronics Corp., Hsin-Chu (TW)

(72) Inventors: Tsung-Ling Li, Hsinchu County (TW); Yung-Cheng Lin, Hsinchu County (TW); Ju-Lin Huang, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 815 days.

(21) Appl. No.: 17/990,727

(22) Filed: Nov. 20, 2022

(65) Prior Publication Data

US 2023/0290715 A1     Sep. 14, 2023

Related U.S. Application Data

(60) Provisional application No. 63/318,376, filed on Mar. 9, 2022.

(51) Int. Cl.
G06F 3/044          (2006.01)
G06F 3/041          (2006.01)
          (Continued)

(52) U.S. Cl.
CPC .......... H10W 70/65 (2026.01); G06F 3/0412 (2013.01); G06F 3/04164 (2019.05); G06F 3/0446 (2019.05); H10W 90/701 (2026.01)

(58) Field of Classification Search
CPC ........ G06F 3/0412; G06F 3/041; G06F 3/044; G06F 3/04164; G06F 3/0446;
          (Continued)

(56) References Cited

U.S. PATENT DOCUMENTS

| | | | |
|---|---|---|---|
| 6,689,634 B1 * | 2/2004 | Lyne ...................... | H05K 1/112 |
| | | | 438/106 |
| 2007/0001286 A1 | 1/2007 | Chiu | |
| 2012/0000068 A1 * | 1/2012 | Sakamoto ............... | H01L 24/29 |
| | | | 29/852 |

FOREIGN PATENT DOCUMENTS

| | | | | |
|---|---|---|---|---|
| JP | 2000100999 A | * | 4/2000 | ............ H01L 23/32 |
| JP | 2003-7924 | | 1/2003 | |

(Continued)

*Primary Examiner* — Timothy J Thompson
*Assistant Examiner* — Guillermo J Egoavil
(74) *Attorney, Agent, or Firm* — Winston Hsu

(57) ABSTRACT

A ball grid array (BGA) package for use in a touch panel controller includes a package substrate and a plurality of solder bumps. The plurality of solder bumps are disposed on the package substrate, arranged in a staggered pattern surrounding a hollow region on the package substrate, and coupled to electrodes of a touch panel via a multi-layer circuit board. The staggered pattern includes Ys1 top rows and Ys2 bottom rows, a minimum vertical distance between centers of two vertically adjacent solder bumps in the Ys1 top rows and the Ys2 bottom rows being referred to as an equivalent vertical pitch, and Ys1, Ys2 being integers exceeding 2. the hollow region has a minimum length defined by the minimum length=((Ys1−2)+(Ys2−2))*the equivalent vertical pitch.

20 Claims, 5 Drawing Sheets

(51) Int. Cl.
    *H01L 23/498*     (2006.01)
    *H10W 70/65*     (2026.01)
    *H10W 90/00*     (2026.01)

(58) Field of Classification Search
    CPC ......... H01L 23/49816; H01L 23/49838; H01L
                 23/498; H05K 1/0298; H05K 1/114;
                 H05K 2201/09227; H05K 2201/10734
    USPC ........................................................ 361/772
    See application file for complete search history.

(56)                 References Cited

FOREIGN PATENT DOCUMENTS

| | | | | |
|---|---|---|---|---|
| JP | 2008193121 A | * | 8/2008 | ............ H01L 24/19 |
| TW | 489432 | | 6/2002 | |
| TW | 200828541 | | 7/2008 | |
| TW | 200828541 A | * | 7/2008 | ............ H01L 23/48 |

* cited by examiner

COMPACT BALL GRID ARRAY PACKAGE FOR USE IN TOUCH PANEL CONTROLLER AND TOUCH PANEL DEVICE UTILIZING THE SAME

CROSS REFERENCE TO RELATED APPLICATIONS

This application claims the benefit of U.S. Provisional Application No. 63/318,376, filed on Mar. 9, 2022. The content of the application is incorporated herein by reference.

BACKGROUND OF THE INVENTION

1. Field of the Invention

The invention relates to integrated circuit packaging, and in particular, to a compact ball grid array package for use in touch panel controller and touch panel device utilizing the same.

2. Description of the Prior Art

Touch panel devices are input/output (I/O) devices that receive user's input from fingers or styluses to control operations thereof, and may be computer monitors, tablets, smartphones, portable gaming devices or other touch appliances. A touch panel device typically employs a touch panel controller to process signals from a touch panel to detect the location of a user's touch. The touch panel is a sensor array in which each sensor can detect a touch event (or the lack thereof) and generate a corresponding sensor signal to the touch panel controller. As the size of the touch panel grows larger, the numbers of the sensors will increase, generating more sensor signals for the touch panel controller to process. Since the touch panel controller is an integrated circuit, in the related art, the package sizes of the touch panel controllers are increased to accommodate the increased number of pins/balls for receiving the sensor signals, leading to an increase in manufacturing costs.

SUMMARY OF THE INVENTION

According to an embodiment of the invention, a ball grid array (BGA) package for use in a touch panel controller includes a package substrate and a plurality of solder bumps. The plurality of solder bumps are disposed on the package substrate, arranged in a staggered pattern surrounding a hollow region on the package substrate, and coupled to electrodes of a touch panel via a multi-layer circuit board. The staggered pattern includes Ys1 top rows and Ys2 bottom rows, a minimum vertical distance between centers of two vertically adjacent solder bumps in the Ys1 top rows and the Ys2 bottom rows being referred to as an equivalent vertical pitch, and Ys1, Ys2 being integers exceeding 2. the hollow region has a minimum length defined by the minimum length=((Ys1−2)+(Ys2−2))*the equivalent vertical pitch.

According to another embodiment of the invention, a touch panel device includes a circuit board and a touch panel controller. The touch panel controller includes a ball grid array (BGA) package including a package substrate and a plurality of solder bumps. The plurality of solder bumps are disposed on the package substrate, arranged in a staggered pattern surrounding a hollow region on the package substrate, and coupled to electrodes of a touch panel via a multi-layer circuit board. The staggered pattern includes Ys1 top rows and Ys2 bottom rows, a minimum vertical distance between centers of two vertically adjacent solder bumps in the Ys1 top rows and the Ys2 bottom rows being referred to as an equivalent vertical pitch, and Ys1, Ys2 being integers exceeding 2. the hollow region has a minimum length defined by the minimum length=((Ys1−2)+(Ys2−2))*the equivalent vertical pitch.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
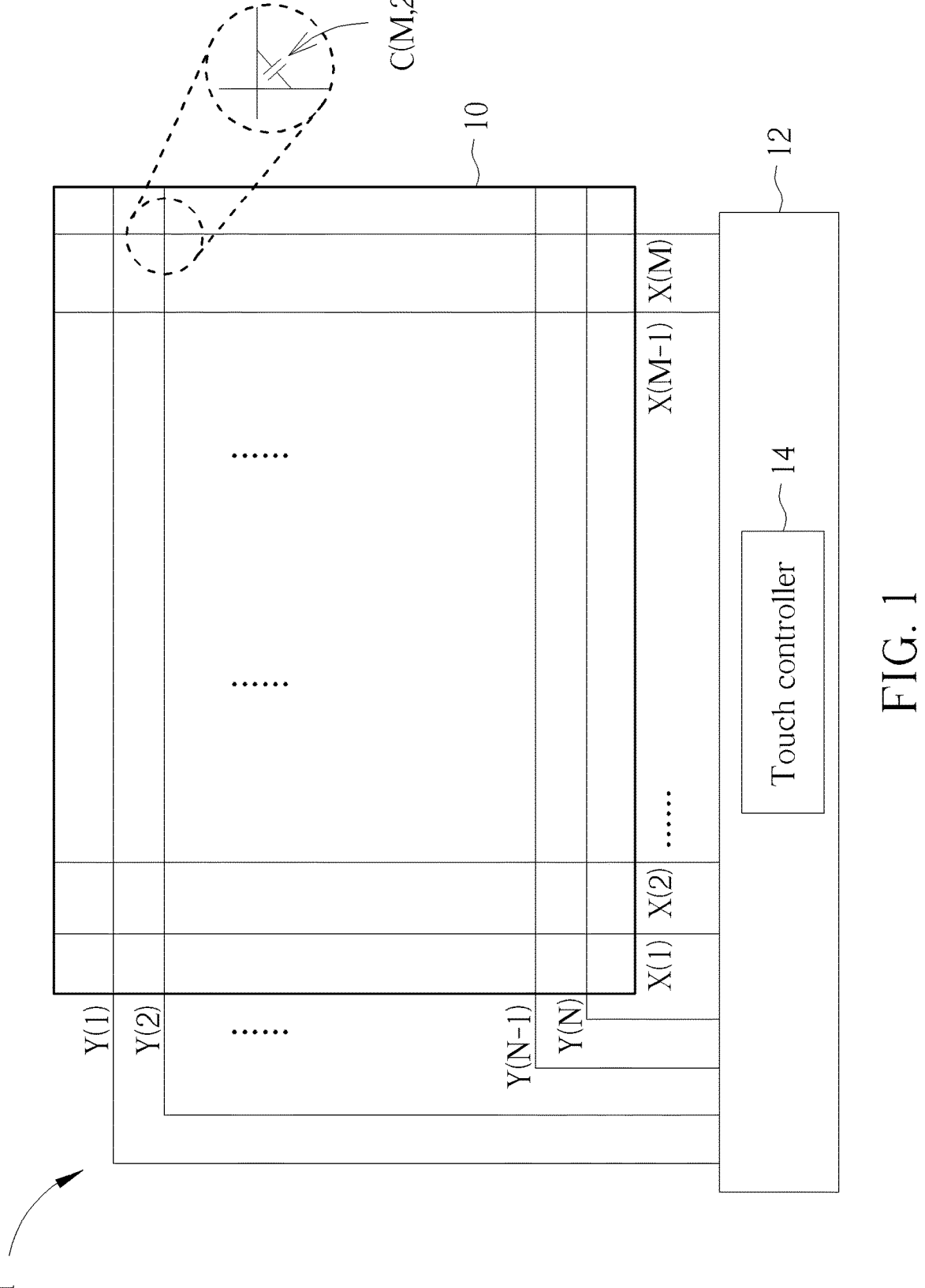
FIG. 1 is a schematic diagram of a touch panel device according to an embodiment of the invention.

FIG. 1 is a schematic diagram of a touch panel device 1 according to an embodiment of the invention. The touch panel device 1 may include a touch panel 10, a circuit board 12 and a touch panel controller 14. The touch panel 10 may include electrodes X(1) to X(M) and electrodes Y(1) to Y(N), N and M being positive integers exceeding 1, and N and M being equal to or different from each other. The touch panel controller 14 may be mounted on the circuit board 12. The touch panel controller 14 may be coupled to the touch panel 10 via the circuit board 12, the electrodes X(1) to X(M) and the electrodes Y(1) to Y(N).

The touch panel device 1 may be a smartphone, a tablet, a point-of-sale (POS) system, an automated teller machine, a smart appliance, or other touch panel-based devices. The circuit board 12 may be a multi-layer printed circuit board (PCB) or a multi-layer flexible circuit board (FCB). The touch panel controller 14 may be an integrated circuit.

In the embodiment, the touch panel 10 may be of the mutual capacitive type. In other embodiments, the touch panel 10 may be of the self-capacitive type. The electrodes X(1) to X(M) may be sequentially arranged on the touch panel 10 from left to right, and the electrodes Y(1) to Y(N) may be sequentially arranged on the touch panel 10 from top to bottom. The electrodes X(1) to X(M) and the electrodes Y(1) to Y(N) may cross each other and, in some embodiments, the electrodes X(1) to X(M) may be positioned perpendicular to the electrodes Y(1) to Y(N). Further, the electrodes X(1) to X(M) and the electrodes Y(1) to Y(N) may be separated by a dielectric material, generating capacitive coupling C(m,n) at each intersection between an electrode X(m) and an electrode Y(n), m being a positive integer ranging between 1 and M, and n being a positive integer ranging between 1 and N. For example, capacitive coupling C(M,2) is formed at the intersection between the electrode X(M) and an electrode Y(2). The intersections of the electrodes X(1) to X(M) and the electrodes Y(1) to Y(N) may be referred to as touch nodes. When a user touches the touch panel 10, the capacitive coupling at a touch node may vary, and the touch panel controller 14 may detect the variation of the capacitive coupling at the touch node to determine the location of a touch event.

In some embodiments, the electrodes Y(1) to Y(N) may serve as driving electrodes and the electrodes X(1) to X(M) may serve as sensing electrodes. The touch panel controller 14 may drive alternating current (AC) voltages or pulsed voltages on the electrodes Y(1) to Y(N) to form an electric field at each touch node, and detect the capacitive couplings of all touch nodes via the electrodes X(1) to X(M) to determine a touch event. If the finger of a user partially blocks the electric field of a touch node, the electric field at the touch node will be weakened, and the capacitive coupling at the touch node will decrease accordingly, thereby the touch panel controller 14 may determine a touch event upon detecting a drop of the capacitive coupling at the touch node.

The touch panel controller 14 may be coupled to (M+N) electrodes to perform the touch event detection. As the size of the touch panel 10 grows larger, the values of M and N will increase accordingly, leading to an increase of the number of electrodes coupled to the touch panel controller 14. In the embodiment, the touch panel controller 14 includes a ball grid array (BGA) package supporting a bump layout for coupling to an increased number of electrodes of a large-format touch panel 10 while maintaining a compact package size.

Figure 2:
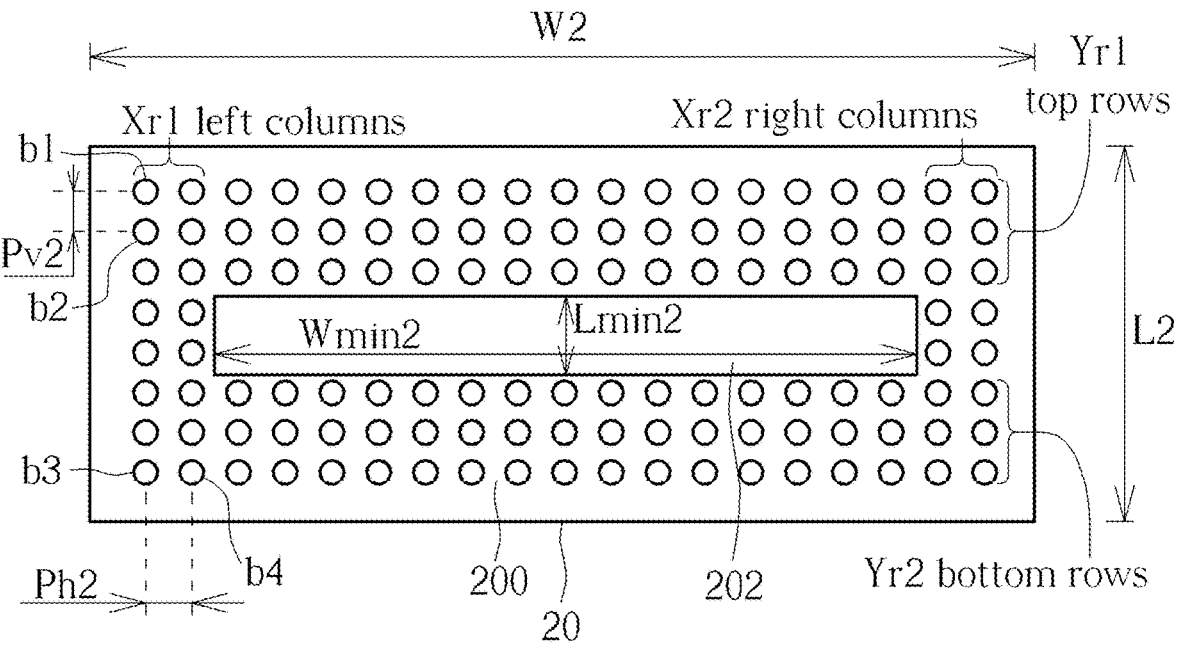
FIG. 2 is a schematic diagram of a ball grid array (BGA) package of a touch panel device in the related art.

FIG. 2 is a schematic diagram of a BGA package 20 of a touch panel device in the related art. The dimension of the BGA package 20 may be expressed as a width W2 by a length L2. For example, the width W2 may be 10 units and the length L2 may be 5 units, where 1 unit may range between 0.5 mm and 2 mm. The BGA package 20 may include a package substrate 200 and P solder bumps, P being an integer exceeding 1, e.g., P being 126. The average density of the solder bump arrangement is 2.5 (=126/10*5) bumps per square unit. The P solder bumps may be disposed on the package substrate 200, and may be arranged in a rectangular pattern surrounding a hollow region 202 on the package substrate 200. The P solder bumps may be coupled to electrodes of a touch panel via a multi-layer circuit board. In general, each solder bump of the BGA package 20 may correspond to a solder pad on the circuit board. The hollow region 202 may be reserved for corresponding vias in the circuit board.

The rectangular pattern may include Yr1 top rows and Yr2 bottom rows, Yr1, Yr2 being integers exceeding 2. Yr1 and Yr2 are both equal to 3 in FIG. 2. The solder bumps in each column may be evenly spaced out along the vertical direction. The minimum vertical distance between the centers of two vertically adjacent solder bumps in the Yr1 top rows and the Yr2 bottom rows may be referred to as a vertical pitch Pv2. The vertical pitch Pv2 may be sufficiently large for a metal trace to pass through the space between the solder pads corresponding to the two vertically adjacent solder bumps. For example, the vertical pitch Pv2 between the centers of the solder bumps b1 and b2 may be 0.5 units to allow a metal trace to pass through the corresponding solder pads.

The hollow region 202 may be defined by a minimum length Lmin2 as expressed in Equation (1):

$$Lmin2 = ((Yr1-2)+(Yr2-2))*Pv2 \qquad (1)$$

where Lmin2 is the minimum length of the hollow region 202; space
Yr1 is the number of the top rows of the solder bumps on the BGA package 20;
Yr2 is the number of the bottom rows of the solder bumps on the BGA package 20; and
Pv2 is the vertical pitch of the solder bumps on the BGA package 20.

The rectangular pattern may include Xr1 left columns and Xr2 right columns, Xr1, Xr2 being integers exceeding 2. Xr1 and Xr2 are both equal to 2 in FIG. 2. The solder bumps in each row may be evenly spaced out along the horizontal direction. The minimum horizontal distance between the centers of two horizontally adjacent solder bumps in the Xr1 left columns and the Xr2 right columns may be referred to as a horizontal pitch Ph2. The horizontal pitch Ph2 may be sufficiently large for a metal trace to pass through the space between the solder pads corresponding to the two horizontally adjacent solder bumps. For example, the horizontal pitch Ph2 between the centers of the solder bumps b3 and b4 may be 0.5 units to allow a metal trace to pass through the corresponding solder pads. The hollow region 202 may further be defined by a minimum width Wmin2 as expressed in Equation (2):

$$Wmin2 = ((Xr1-2)+(Xr2-2))*Ph2 \qquad (2)$$

where Wmin2 is the minimum width of the hollow region 202;
Xr1 is the number of the left columns of the solder bumps on the BGA package 20;
Xr2 is the number of the right columns of the solder bumps on the BGA package 20; and
Ph2 is the horizontal pitch of the solder bumps on the BGA package 20.

Figure 3:
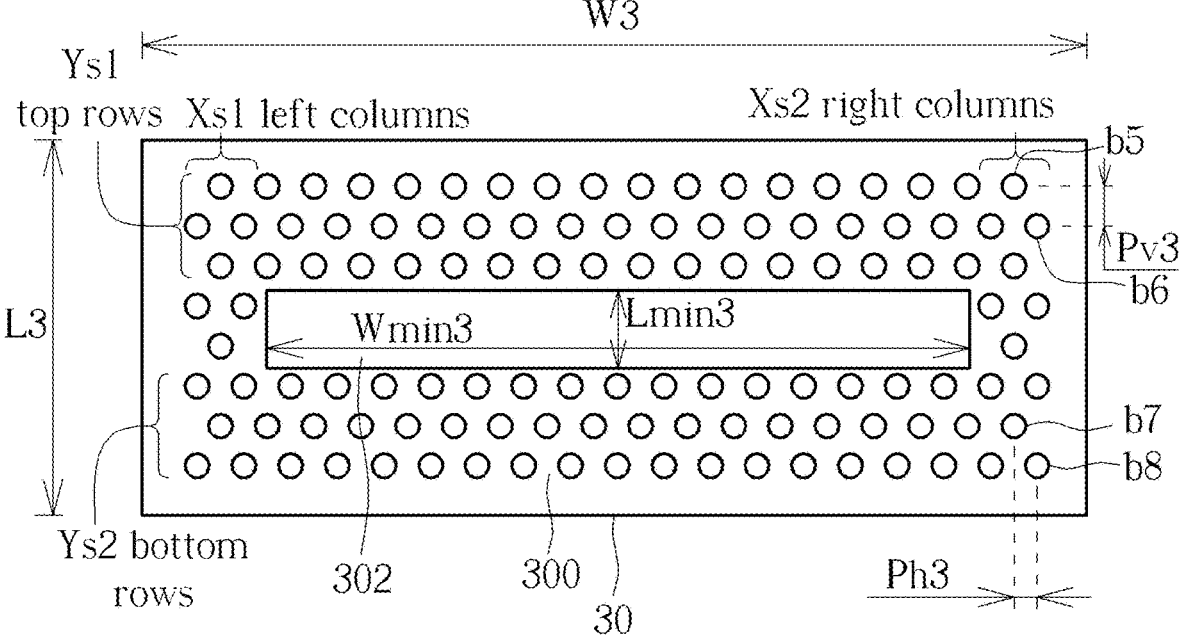
FIG. 3 is a schematic diagram of a BGA package of the touch panel device in FIG. 1.

FIG. 3 is a schematic diagram of a BGA package 30 for use in the touch panel device 1. The dimension of the BGA package 30 may be expressed as a width W3 by a length L3. For example, the width W3 may be 10 units and the length L3 may be 2 units. The BGA package 30 may include a package substrate 300 and a Q solder bumps, Q being an integer exceeding 1, e.g., Q being 116. The average density of the solder bump arrangement is 2.9 (=116/10*4) bumps per square unit, higher than average density of the solder bump arrangement in FIG. 2. The Q solder bumps may be disposed on the package substrate 300, and may be arranged in a staggered pattern surrounding a hollow region 302 on the package substrate 300. The Q solder bumps may be coupled to the electrodes X(1) to X(M), Y(1) to Y(N) of the touch panel 10 via the multi-layer circuit board 12. The hollow region 302 may be reserved for corresponding vias in the circuit board 12.

The staggered pattern may include Ys1 top rows and Ys2 bottom rows, Ys1, Ys2 being integers exceeding 2. In some embodiments, Ys1 may be equal to Ys2, e.g., Ys1 and Ys2 are both equal to 3. In other embodiments, Ys1 may be different from Ys2, e.g., Ys1 is equal to 3 and Ys2 is equal to 2. The solder bumps in each column may be evenly spaced out along the vertical direction. A vertical pitch between the centers of two vertically adjacent solder bumps in the Ys1 top rows and the Ys2 bottom rows may be sufficiently large for a metal trace to pass through the space between the solder pads corresponding to the two vertically adjacent solder bumps. For example, the vertical pitch between the centers of the solder bumps b5 and b6 may be 0.5 units to allow a metal trace to pass through the corresponding solder pads.

The minimum vertical distance between the centers of two vertically adjacent solder bumps in the Ys1 top rows and the Ys2 bottom rows may be referred to as an equivalent vertical pitch Pv3. For example, the equivalent vertical pitch Pv3 between the centers of the solder bumps b5 and b6 may be 0.43(=sqrt(3)/4) units, less than the vertical pitch Pv2 (=0.5 unit) of the BGA package 20. The minimum vertical distance between the centers of two vertically adjacent solder bumps in the Ys1 top rows may be equal to or different from the minimum vertical distance of the Ys2 bottom rows. In the case where the minimum vertical distance between the centers of two vertically adjacent solder bumps in the Ys1 top rows is different from the minimum vertical distance of the Ys2 bottom rows, the smaller one thereof is the equivalent vertical pitch Pv3. The hollow region 302 may be defined by a minimum length Lmin3 as expressed in Equation (3):

$$Lmin3=((Ys1-2)+(Ys2-2))*Pv3 \qquad (3)$$

where Lmin3 is the minimum length of the hollow region 302;

Ys1 is the number of the top rows of the solder bumps on the BGA package 30;

Ys2 is the number of the bottom rows of the solder bumps on the BGA package 30; and Pv3 is the vertical pitch of the solder bumps on the BGA package 30.

The rectangular pattern may include Xs1 left columns and Xs2 right columns, Xs1, Xs2 being integers exceeding 2. In some embodiments, Xs1 may be equal to Xs2, e.g., Xs1 and Xs2 are both equal to 3. In other embodiments, Xs1 may be different from Xs2, e.g., Xs1 is equal to 3 and Xs2 is equal to 2. The solder bumps in each row may be evenly spaced out along the horizontal direction. A horizontal pitch between the centers of two horizontally adjacent solder bumps in the Xs1 left columns and Xs2 right columns may be sufficiently large for a metal trace to pass through the space between the solder pads corresponding to the two horizontally adjacent solder bumps. For example, the horizontal pitch between the centers of the solder bumps b7 and b8 may be 0.5 units to allow a metal trace to pass through the corresponding solder pads.

The minimum horizontal distance between the centers of two horizontally adjacent solder bumps in the Xs1 left columns and the Xs2 right columns may be referred to as an equivalent horizontal pitch Ph3. For example, the equivalent horizontal pitch Ph3 between the centers of the solder bumps b7 and b8 may be 0.25 unit, less than the vertical pitch Ph2 (=0.5 unit) of the BGA package 30. The minimum horizontal distance between the centers of two horizontally adjacent solder bumps in the Xs1 left columns may be equal to or different from the minimum horizontal distance of the Xs2 right columns. In the case where the minimum horizontal distance between the centers of two horizontally adjacent solder bumps in the Xs1 left columns is different from the minimum horizontal distance of the Xs2 right columns, the smaller one thereof is the equivalent horizontal pitch Ph3. The hollow region 302 may further be defined by a minimum width Wmin3 as expressed in Equation (4):

$$Wmin3=((Xs1-2)+(Xs2-2))*Ph3 \qquad (4)$$

where Wmin3 is the minimum width of the hollow region 302;

Xs1 is the number of the left columns of the solder bumps on the BGA package 30;

Xs2 is the number of the right columns of the solder bumps on the BGA package 30; and Ph3 is the equivalent horizontal pitch of the solder bumps on the BGA package 30.

Based on Equations (1) and (2), the minimum length Lmin2 of the hollow region 202 is equal to 2*Pv2, and the minimum width Wmin2 of the hollow region 202 is equal to 2*Ph2. Based on Equations (3) and (4), the minimum length Lmin3 of the hollow region 302 is equal to 2*Pv3, and the minimum width Wmin3 of the hollow region 302 is equal to 2*Ph3. Since Pv3 is less than Pv2, and Ph3 is less than Ph2, the minimum area of the hollow region 302 is less than the minimum area of the hollow region 202.

Further, since the average density of the solder bump arrangement of the BGA package 30 is higher than average density of the solder bump arrangement of the BGA package 20, the staggered arrangement of the solder bumps of the BGA package 30 can be used to reduce the required package area and/or increase the number of the solder bumps for the same bump pitch and the same via pitch, thereby reducing the manufacturing cost and supporting signal transmissions for large-format touch panels.

Figures 4, 5:
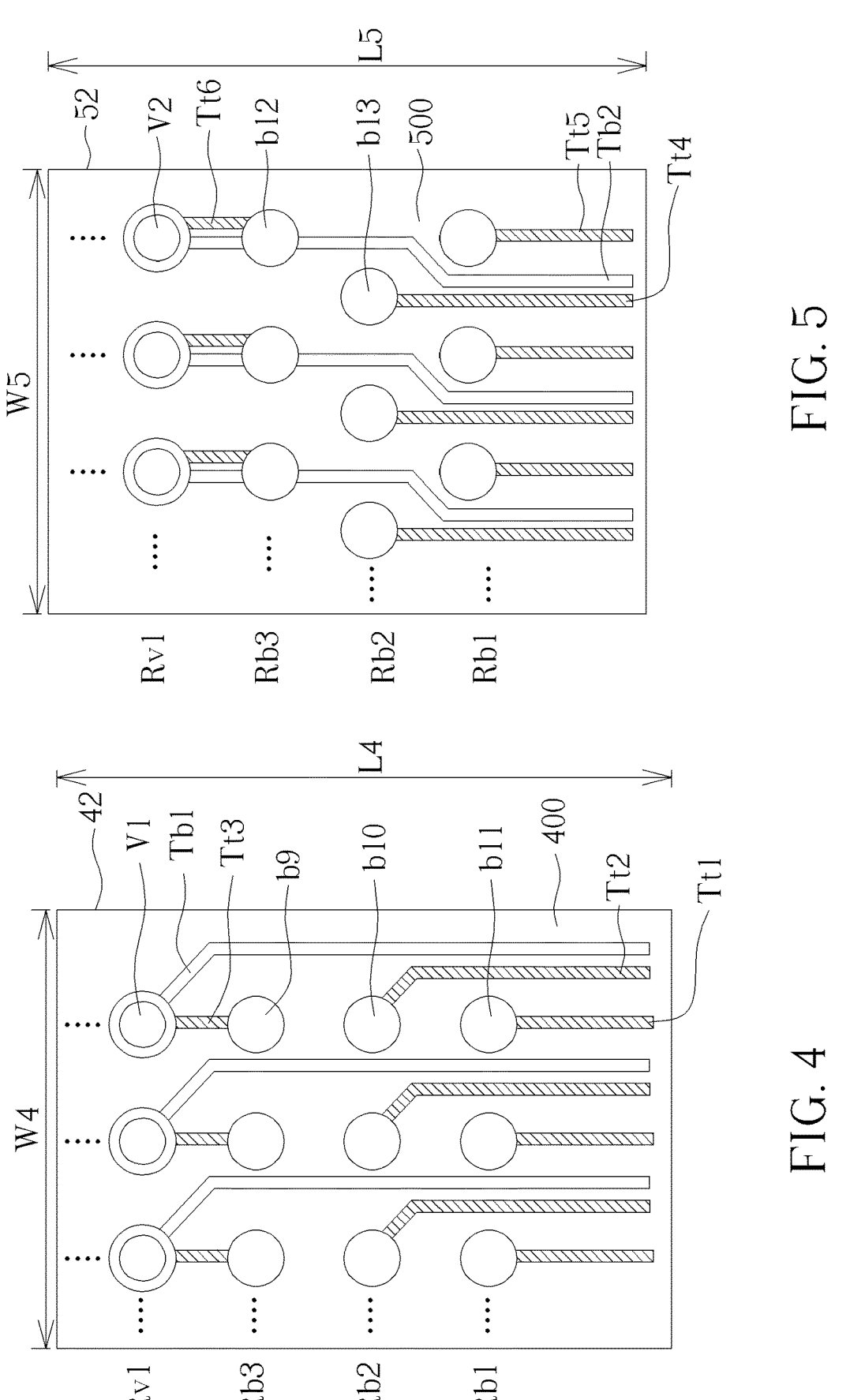
FIG. 4 is a schematic diagram of a portion of a circuit board matching the BGA package in FIG. 2.
FIG. 5 is a schematic diagram of a portion of a circuit board matching the BGA package in FIG. 3.

FIG. 4 is a schematic diagram of a portion of a circuit board 42 matching the BGA package 20. The circuit board 42 may replace the circuit board 12 in FIG. 1. The dimension of the circuit board 42 may be expressed as a width W4 by a length L4, the width W4 of the circuit board 42 exceeding the width W3 of the BGA package 20, and the length L4 of the circuit board 42 exceeding the length L3 of the BGA package 20.

The circuit board 42 may include a board substrate 400, P solder pads, and R vias, R being a positive integer less than P, e.g., P being 126 and R being 34. The P solder pads are disposed on the board substrate 400, and are arranged in a rectangular pattern corresponding to the rectangular pattern of the Q solder bumps on the BGA package 20 and surrounding the R vias. The rectangular pattern of the P solder pads may include Yr1 top rows, Yr2 bottom rows. Xr1 left columns, and Xr2 right columns, e.g. Yr1, Yr2, Xr1 and Xr2 are all equal to 3. The Q solder bumps may be melted by heat to connect to the corresponding P solder pads.

The circuit board 42 may further include a top trace layer, a bottom trace layer, P top traces and R bottom traces. The R vias may be arranged into 2 rows corresponding to the hollow region 202 of the BGA package 20 and may pass through the board substrate 400 to connect the P top traces to the R bottom traces, so as to transmit signals of the capacitive coupling from the touch panel 10 to the solder bumps in the Yr1 top rows or the Yr2 bottom rows of the BGA packages 20. The top trace layer is disposed on a top side of the board substrate 400, and the bottom trace layer is disposed on a bottom side of the board substrate 400, the bottom side being arranged opposite to the top side.

The P top traces may be disposed on the top trace layer and a portion of the P top traces may be coupled to two outermost rows of the Yr1 top rows and two outermost rows of the Yr2 bottom rows away from the R vias, and another portion of the P top traces may be coupled from an innermost row of the Yr1 top rows and an innermost row of the Yr2 bottom rows to the R vias. For example, the top traces Tt1 and Tt2 may be respectively coupled to the solder bump b11 in the row Rb1 and the solder bump b10 in the row Rb2, and the top trace Tt3 may be coupled from the solder bump b9 in the row Rb3 to the via V1 in the row Rv1. The P top traces do not cross each other. For examples, the top traces Tt1 to Tt3 do not cross each other.

The R bottom traces may be disposed on the bottom trace layer and may be coupled to the R vias, and, each bottom traces may pass through the space at the right of the solder bumps in a column. For example, the bottom trace Tb1 may be coupled to the via V1, and may pass through the space at the right of the solder bumps b9 to b11. The R bottom traces and the P top traces do not cross each other. For examples, the top traces Tt1 to Tt3 and the bottom trace Tb1 do not cross each other.

Likewise, another portion of the P top traces may be coupled to two outermost columns of the Xr1 left columns and two outermost columns of the Xr2 right columns away from the R vias, and a remaining portion of the P top traces may be coupled from an innermost column of the Xr1 left columns and an innermost column of the Xr2 right columns to the R vias. The P top traces may be routed on the top trace layer without crossing each other. Further, the R bottom traces and the P top traces do not cross each other.

FIG. 5 is a schematic diagram of a portion of a circuit board 52 matching the BGA package 30 according to an embodiment of the invention. The dimension of the circuit board 52 may be expressed as a width W5 by a length L5, the width W5 of the circuit board 52 exceeding the width W3 of the BGA package 30, and the length L5 of the circuit board 52 exceeding the length L3 of the BGA package 30.

The circuit board 52 may include a board substrate 500, Q solder pads, and S vias, S being a positive integer less than Q, e.g., Q being 116 and S being 35. The Q solder pads are disposed on the board substrate 500, and are arranged in a staggered pattern corresponding to the staggered pattern of the Q solder bumps on the BGA package 30 and surrounding the S vias. The staggered pattern of the Q solder pads may include Ys1 top rows, Ys2 bottom rows. Xs1 left columns, and Xs2 right columns, e.g. Ys1, Ys2, Xs1 and Xs2 are all equal to 3. The Q solder bumps may be melted by heat to connect to the corresponding Q solder pads.

The circuit board 52 may be a double layer PCB or FCB, and may further include a top trace layer, a bottom trace layer, Q top traces and S bottom traces. The S vias may be arranged into 2 rows corresponding to the hollow region 302 of the BGA package 30 and may pass through the board substrate 500 to connect the Q top traces to the S bottom traces, so as to transmit signals of the capacitive coupling from the touch panel 10 to the solder bumps in the Ys1 top rows or the Ys2 bottom rows of the BGA packages 30. The top trace layer is disposed on a top side of the board substrate 500, and the bottom trace layer is disposed on a bottom side of the board substrate 500, the bottom side being arranged opposite to the top side.

The Q top traces may be disposed on the top trace layer and a portion of the Q top traces may be coupled to two outermost rows of the Ys1 top rows and two outermost rows of the Ys2 bottom rows away from the S vias, and another portion of the Q top traces may be coupled from an innermost row of the Ys1 top rows and an innermost row of the Ys2 bottom rows to the S vias. For example, the top traces Tt4 and Tt5 may be respectively coupled to the solder bump b13 in the row Rb2 and the solder bump b14 in the row Rb1, and the top trace Tt6 may be coupled from the solder bump b12 in the row Rb3 to the via V2 in the row Rv1. The Q top traces may be routed on the top trace layer without crossing each other. For examples, the top traces Tt4, Tt5 and Tt6 do not cross each other, thereby reducing signal interference and enhancing signal integrity.

The S bottom traces may be disposed on the bottom trace layer and may be coupled to the S vias, and, in turn, the S bottom traces may pass through the spaces between the solder bumps in the two outermost rows of the Ys1 top rows or the spaces between the solder bumps in the two outermost rows of the Ys2 bottom rows. For example, the bottom trace Tb2 may be coupled to the via V2, and passes through the space between the solder bumps b13 and b14. The S bottom traces and the Q top traces do not cross each other. For examples, the top traces Tt4, Tt5 and Tt6 and the bottom trace Tb2 do not cross each other, thereby reducing signal interference and enhancing signal integrity.

Likewise, another portion of the Q top traces may be coupled to two outermost columns of the Xs1 left columns and two outermost columns of the Xs2 right columns away from the S vias, and a remaining portion of the Q top traces may be coupled from an innermost column of the Xs1 left columns and an innermost column of the Xs2 right columns to the S vias. The Q top traces may be routed on the top trace layer without crossing each other, and further, the S bottom traces and the Q top traces do not cross each other, thereby reducing signal interference and enhancing signal integrity.

In this fashion, the signals of the capacitive coupling from the touch panel 10 may be transmitted to the solder bumps in the Ys1 top rows, the Ys2 bottom rows, the Xs1 left columns, and the Xs2 right columns of the BGA packages 30 without signal interference.

Figures 6, 7:
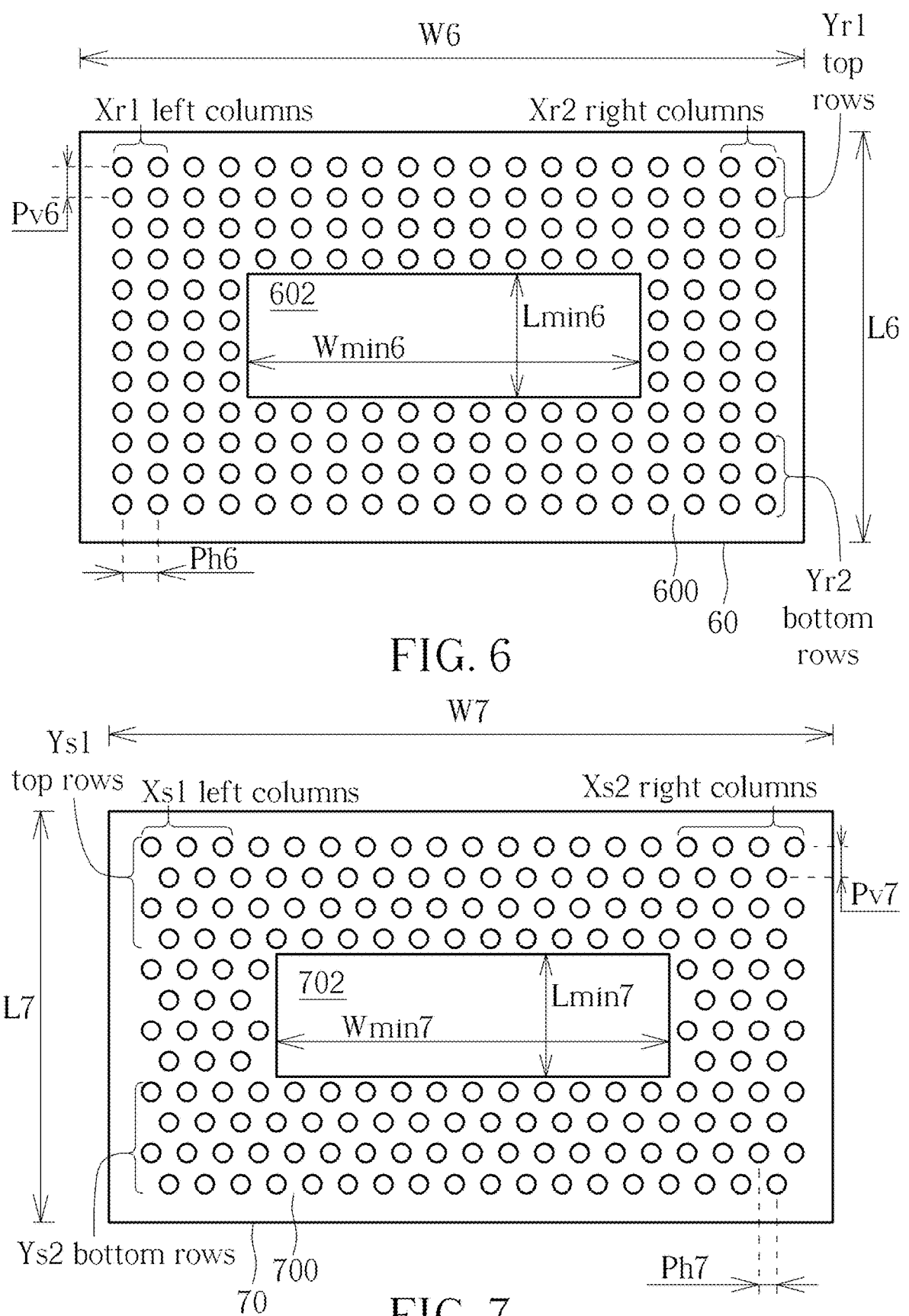
FIG. 6 is a schematic diagram of a BGA package according to another embodiment in the related art.
FIG. 7 is a schematic diagram of another BGA package for use in the touch panel device in FIG. 1.

FIG. 6 is a schematic diagram of a BGA package 60 of a touch panel device according to another embodiment in the related art. The dimension of the BGA package 60 may be expressed as a width W6 by a length L6. For example, the width W6 may be 10 units and the length L6 may be 4 units. The BGA package 60 may include a package substrate 600 and P solder bumps, P being an integer exceeding 1, e.g., P being 184. The average density of the solder bump arrangement is 2.6 (=184/10*7) bumps per square unit. The P solder bumps may be disposed on the package substrate 600, and may be arranged in a rectangular pattern surrounding a hollow region 602 on the package substrate 600.

The rectangular pattern of the solder bumps in the BGA package 60 is similar to the BGA package 20, except that the rectangular pattern of the solder bumps in the BGA package 60 includes 4 top rows and 4 bottom rows, 4 left columns and 4 right columns, that is, Yr1, Yr2, Xr1 and Xr2 are all equal to 4. The hollow region 602 may be defined by a minimum length Lmin6 and a minimum width Wmin6. Based on Equations (1) and (2), the minimum length Lmin6 of the hollow region 602 is equal to 4*Pv2, and the minimum width Wmin6 of the hollow region 602 is equal to 4*Ph2, and therefore, the minimum area of the hollow region 602 is equal to 16*Pv2*Ph2.

FIG. 7 is a schematic diagram of a BGA package 70 for use in the touch panel device 1. The dimension of the BGA package 70 may be expressed as a width W7 by a length L7. For example, the width W7 may be 10 units and the length L7 may be 4 units. The BGA package 70 may include a package substrate 700 and Q solder bumps, Q being an integer exceeding 1, e.g., Q being 164. The average density of the solder bump arrangement is 2.9 (=164/10*5.7) bumps per square unit, higher than the average density of the solder bump arrangement in the BGA package 60 (=2.6). The Q solder bumps may be disposed on the package substrate 700, and may be arranged in a staggered pattern surrounding a hollow region 702 on the package substrate 700.

The staggered pattern of the solder bumps in the BGA package 70 is similar to the BGA package 30, except that the staggered pattern of the solder bumps in the BGA package

70 includes 4 top rows and 4 bottom rows, 4 left columns and 4 right columns, that is, Ys1, Ys2, Xs1 and Xs2 are all equal to 4. The hollow region 702 may be defined by a minimum length Lmin6 and a minimum width Wmin6. Based on Equations (3) and (4), the minimum length Lmin7 of the hollow region 702 is equal to 4*Pv3, and the minimum width Wmin7 of the hollow region 702 is equal to 4*Ph3, and therefore, the minimum area of the hollow region 702 is equal to 16*Pv3*Ph3. Since Pv3 is less than Pv2, and Ph3 is less than Ph2, the minimum area of the hollow region 702 is less than the minimum area of the hollow region 602.

Further, since the average density of the solder bump arrangement of the BGA package 70 is higher than average density of the solder bump arrangement of the BGA package 60, the staggered arrangement of the solder bumps of the BGA package 70 can be used to reduce the required package area and/or increase the number of the solder bumps for the same bump pitch and the same via pitch, thereby reducing the manufacturing cost and supporting signal transmissions for large-format touch panels.

Figure 8:
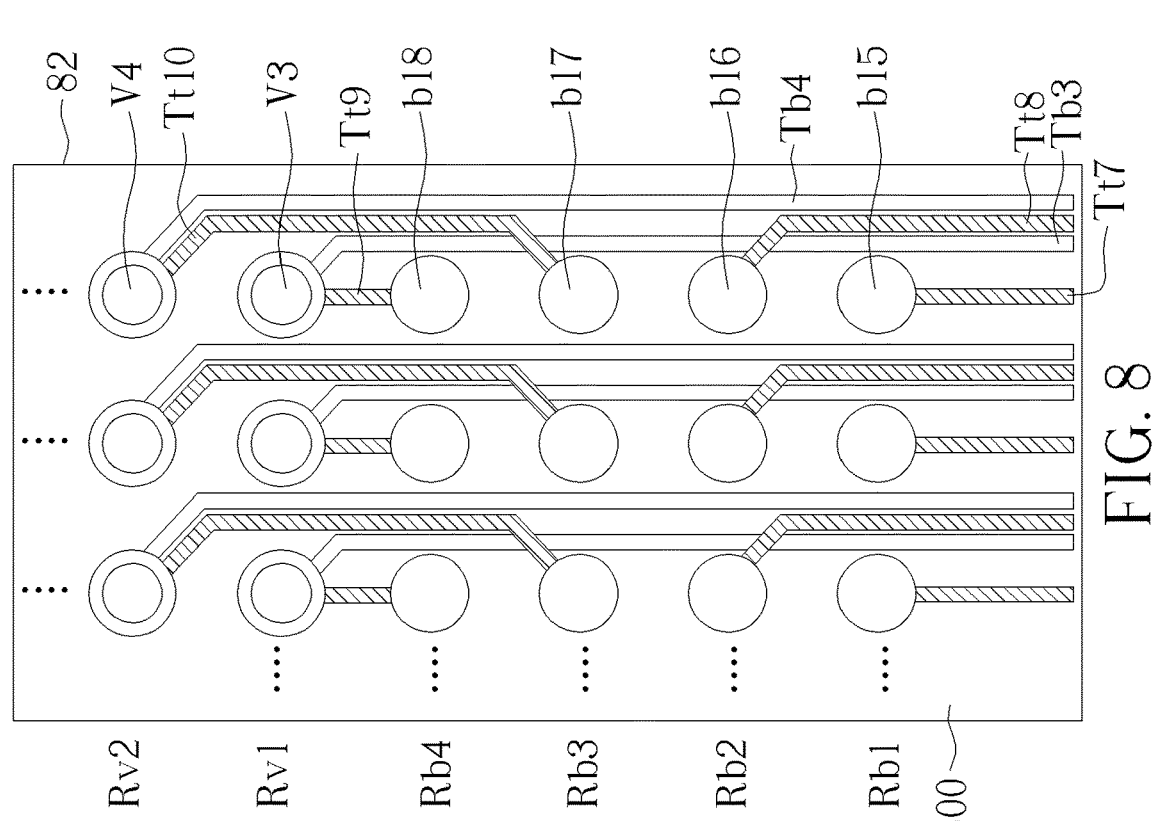
FIG. 8 is a schematic diagram of a portion of a circuit board the BGA package in FIG. 6.

FIG. 8 is a schematic diagram of a portion of a circuit board 82 matching the BGA package 60. The circuit board 82 may include a board substrate 800, P solder pads, R vias, a top trace layer, a bottom trace layer, P top traces and R bottom traces, e.g., P being 184 and R being 68. The arrangement of the P solder pads on the circuit board 82 may be similar to circuit board 42, except that the rectangular pattern of the P solder pads may include 4 top rows, 4 bottom rows. 4 left columns, and 4 right columns, that is, Yr1, Yr2, Xr1 and Xr2 are all equal to 4. The R vias may be arranged into 4 rows corresponding to the hollow region 602 of the BGA package 60. The explanation for the arrangement of the solder pads and vias of the circuit board 82 can refer to the preceding paragraphs and will not be repeated here.

The P top traces may be disposed on the top trace layer and a portion of the P top traces may be coupled to two outermost rows of the Yr1 top rows and two outermost rows of the Yr2 bottom rows away from the R vias, and another portion of the P top traces may be coupled from two innermost rows of the Yr1 top rows and two innermost rows of the Yr2 bottom rows to the R vias. For example, the top traces Tt7 and Tt8 may be respectively coupled to the solder bump b15 in the row Rb1 and the solder bump b16 in the row Rb2, the top trace Tt9 may be coupled from the solder bump b18 in the row Rb3 to the via V3 in the row Rv1, and the top trace Tt10 may be coupled from the solder bump b17 in the row Rb4 to the via V4 in the row Rv2. The P top traces do not cross each other. For examples, the top traces Tt7 to Tt10 do not cross each other.

The R bottom traces may be disposed on the bottom trace layer and may be coupled to the R vias, and in turn, the R bottom traces may pass through the spaces at the right of the solder bumps in R columns. For example, the bottom trace Tb3 may be coupled to the via V3, and may pass through the space at the right of the solder bumps b5 to b18, and the bottom trace Tb4 may be coupled to the via V4, and may pass through the space at the right of the solder bumps b5 to b18. The R bottom traces and the P top traces do not cross each other. For examples, the top traces Tt7 to Tt10 and the bottom traces Tb3 and Tb4 do not cross each other.

Likewise, another portion of the P top traces may be coupled to two outermost columns of the Xr1 left columns and two outermost columns of the Xr2 right columns away from the R vias, and a remaining portion of the P top traces may be coupled from two innermost columns of the Xr1 left columns and two innermost columns of the Xr2 right columns to the R vias. The P top traces may be routed on the top trace layer without crossing each other. Further, the R bottom traces and the P top traces do not cross each other.

Figure 9:
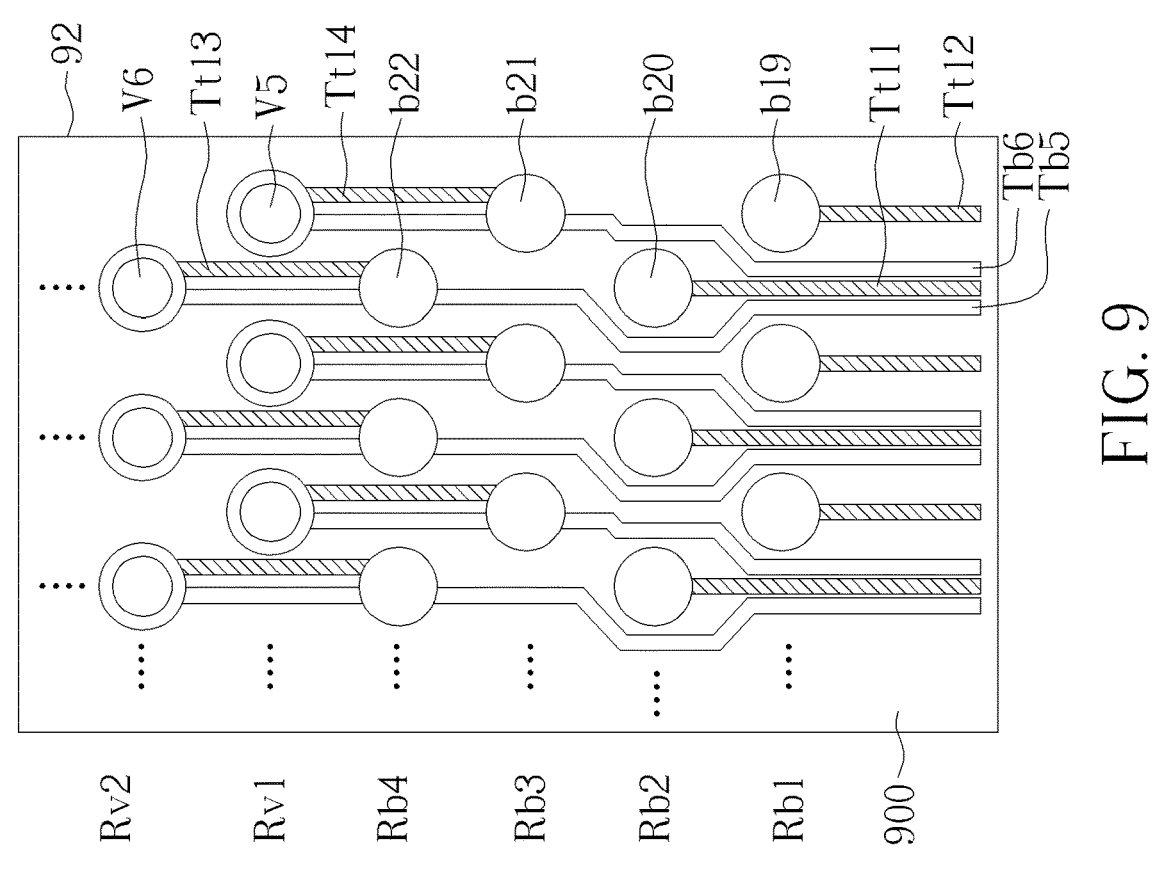
FIG. 9 is a schematic diagram of a portion of a circuit board matching the BGA package in FIG. 7.

FIG. 9 is a schematic diagram of a portion of a circuit board 92 matching the BGA package 70. The circuit board 92 may replace the circuit board 12 in FIG. 1. The circuit board 12 may include a board substrate 900, Q solder pads, S vias, a top trace layer, a bottom trace layer, Q top traces and S bottom traces, e.g., Q being 164 and S being 74. The arrangement of the Q solder pads on the circuit board 92 may be similar to circuit board 52, except that the staggered pattern of the Q solder pads may include 4 top rows, 4 bottom rows. 4 left columns, and 4 right columns, that is, Ys1, Ys2, Xs1 and Xs2 are all equal to 4. The S vias may be arranged into 4 rows corresponding to the hollow region 702 of the BGA package 70. The explanation for the arrangement of the solder pads and vias of the circuit board 92 can refer to the preceding paragraphs and will not be repeated here.

The Q top traces may be disposed on the top trace layer and a portion of the Q top traces may be coupled to two outermost rows of the Ys1 top rows and two outermost rows of the Ys2 bottom rows away from the S vias, and another portion of the Q top traces may be coupled from two innermost rows of the Ys1 top rows and two innermost rows of the Ys2 bottom rows to the S vias. For example, the top traces Tt11 and Tt12 may be respectively coupled to the solder bump b20 in the row Rb1 and the solder bump b19 in the row Rb2, the top trace Tt13 may be coupled from the solder bump b22 in the row Rb4 to the via V6 in the row Rv2, and the top trace Tt14 may be coupled from the solder bump b21 in the row Rb3 to the via V5 in the row Rv1. The Q top traces do not cross each other. For examples, the top traces Tt11 to Tt14 do not cross each other, thereby reducing signal interference and enhancing signal integrity.

The S bottom traces may be disposed on the bottom trace layer and may be coupled to the S vias, and in turn, the S bottom traces may pass through the spaces between the solder bumps in the two outermost rows of the Ys1 top rows or the spaces between the solder bumps in the two outermost rows of the Ys2 bottom rows. For example, the bottom trace Tb5 may be coupled to the via V6, and may pass through the space between the solder bumps b19 and b20. The S bottom traces and the Q top traces do not cross each other. For examples, the top traces Tt11 to Tt14 and the bottom traces Tb5 and Tb6 do not cross each other, thereby reducing signal interference and enhancing signal integrity.

Likewise, another portion of the Q top traces may be coupled to two outermost columns of the Xs1 left columns and two outermost columns of the Xs2 right columns away from the S vias, and a remaining portion of the Q top traces may be coupled from two innermost columns of the Xs1 left columns and two innermost columns of the Xs2 right columns to the S vias. The Q top traces may be routed on the top trace layer without crossing each other, and further, the S bottom traces and the Q top traces do not cross each other, thereby reducing signal interference and enhancing signal integrity.

The various embodiments in the present invention utilize staggered bump layouts and minimum hollow regions to reduce the package size of the touch panel controller while supporting signal transmissions for large-format touch panels.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A ball grid array (BGA) package for use in a touch panel controller, the BGA package comprising:
a package substrate; and
a plurality of solder bumps disposed on the package substrate, arranged in a staggered pattern surrounding a hollow region on the package substrate, and coupled to electrodes of a touch panel via a multi-layer circuit board, the staggered pattern comprising Ys1 top rows and Ys2 bottom rows, a minimum vertical distance between centers of two vertically adjacent solder bumps in the Ys1 top rows and the Ys2 bottom rows being referred to as an equivalent vertical pitch, and Ys1, Ys2 being integers exceeding 2;
wherein the hollow region has a minimum length defined by:

the minimum length=((Ys1−2)+(Ys2−2))*the equivalent vertical pitch.

2. The BGA package of claim 1, wherein:
the staggered pattern comprises Xs1 left columns and Xs2 right columns, Xs1, Xs2 being integers exceeding 2; and
a minimum horizontal distance between centers of two horizontally adjacent solder bumps in the Xs1 left columns and the Xs2 right columns is referred to as an equivalent horizontally pitch;
the hollow region further has a minimum width defined by:

the minimum width=((Xs1−2)+(Xs2−2))*the equivalent horizontal pitch.

3. The BGA package of claim 2, wherein Ys1 is equal to Ys2, and Xs1 is equal to Xs2.

4. The BGA package of claim 2, wherein a minimum horizontal distance between centers of two horizontally adjacent solder bumps in the Xs1 left columns is different from a minimum horizontal distance between centers of two horizontally adjacent solder bumps in the Xs2 right columns.

5. The BGA package of claim 2, wherein a minimum horizontal distance between centers of two horizontally adjacent solder bumps in the Xs1 left columns is equal to a minimum horizontal distance between centers of two horizontally adjacent solder bumps in the Xs2 right columns.

6. The BGA package of claim 1, wherein a minimum vertical distance between centers of two vertically adjacent solder bumps in the Ys1 top rows is different from a minimum vertical distance between centers of two vertically adjacent solder bumps in the Ys2 bottom rows.

7. The BGA package of claim 1, wherein a minimum vertical distance between centers of two vertically adjacent solder bumps in the Ys1 top rows is equal to a minimum vertical distance between centers of two vertically adjacent solder bumps in the Ys2 bottom rows.

8. A touch panel device comprising:
a circuit board; and
a touch panel controller comprising a ball grid array (BGA) package comprising:
a package substrate; and
a plurality of solder bumps disposed on the package substrate, arranged in a staggered pattern surrounding a hollow region on the package substrate, and coupled to electrodes of a touch panel via the circuit board, the staggered pattern comprising Ys1 top rows and Ys2 bottom rows, a minimum vertical distance between centers of two vertically adjacent solder bumps in the Ys1 top rows and the Ys2 bottom rows being referred to as an equivalent vertical pitch, and Ys1, Ys2 being integers exceeding 2;
wherein the hollow region has a minimum length defined by:

the minimum length=((Ys1−2)+(Ys2−2))*the equivalent vertical pitch.

9. The touch panel device of claim 8, wherein the circuit board comprises:
a board substrate;
a plurality of solder pads disposed on the board substrate, arranged in a staggered pattern corresponding to the staggered pattern of the plurality of solder bumps, and connected to the plurality of solder bumps, the staggered pattern of the plurality of solder pads comprising Ys1 top rows and Ys2 bottom rows; and
a plurality of vias passing through the board substrate, corresponding to the hollow region of the BGA package, and coupled to an innermost row of the Ys1 top rows and an innermost row of the Ys2 bottom rows closest to the plurality of vias.

10. The touch panel device of claim 9, wherein the circuit board further comprises:
a top trace layer disposed on a top side of the board substrate;
a bottom trace layer disposed on a bottom side of the board substrate, the bottom side being arranged opposite to the top side;
a plurality of top traces disposed on the top trace layer and coupled to two outermost rows of the Ys1 top rows and two outermost rows of the Ys2 bottom rows away from the plurality of vias; and
a plurality of bottom traces disposed on the bottom trace layer and coupled to the plurality of vias.

11. The touch panel device of claim 10, wherein the plurality of top traces and the plurality of bottom traces do not cross with each other.

12. The touch panel device of claim 9, wherein:
the staggered pattern of the plurality of solder pads further comprises Xs1 left columns and Xs2 right columns, Xs1, Xs2 being integers exceeding 2; and
the plurality of vias is further coupled to an innermost column of the Xs1 left columns and an innermost column of the Xs2 right columns closest to the plurality of vias.

13. The touch panel device of claim 8, wherein the circuit board comprises:
a board substrate;
a plurality of solder pads disposed on the board substrate, arranged in a staggered pattern corresponding to the staggered pattern of the plurality of solder bumps, and connected to the plurality of solder bumps, the staggered pattern of the plurality of solder pads comprising Ys1 top rows and Ys2 bottom rows, and Ys1, Ys2 being integers exceeding 2; and
a plurality of vias disposed on the board substrate, corresponding to the hollow region of the BGA package, and coupled to two innermost rows of the Ys1 top rows and two innermost rows of the Ys2 bottom rows closest to the plurality of vias.

14. The touch panel device of claim 13, wherein the circuit board further comprises:

a top trace layer disposed on a top side of the board substrate;

a bottom trace layer disposed on a bottom side of the board substrate, the bottom side being arranged opposite to the top side;

a plurality of top traces disposed on the top trace layer and coupled to two outermost rows of the Ys1 top rows and two outermost rows of the Ys2 bottom rows away from the plurality of vias; and a plurality of bottom traces disposed on the bottom trace layer and coupled to the plurality of vias.

15. The touch panel device of claim 14, wherein the plurality of top traces and the plurality of bottom traces do not cross with each other.

16. The touch panel device of claim 13, wherein:

the staggered pattern of the plurality of solder pads further comprises Xs1 left columns and Xs2 right columns, Xs1, Xs2 being integers exceeding 2; and the plurality of vias is further coupled to two innermost columns of the Xs1 left columns and two innermost columns of the Xs2 right columns closest to the plurality of vias.

17. The touch panel device of claim 8, wherein:

the staggered pattern of the plurality of solder bumps comprises Xs1 left columns and Xs2 right columns, Xs1, Xs2 being integers exceeding 2; and a minimum horizontal distance between centers of two horizontally adjacent solder bumps in the Xs1 left columns and the Xs2 right columns is referred to as an equivalent horizontally pitch;

the hollow region further has a minimum width defined by:

$$\text{the minimum width}=((Xs1-2)+(Xs2-2))*\text{the equivalent horizontal pitch.}$$

18. The touch panel device of claim 17, wherein Ys1 is equal to Ys2, and Xs1 is equal to Xs2.

19. The touch panel device of claim 17, wherein a minimum horizontal distance between centers of two horizontally adjacent solder bumps in the Xs1 left columns is equal to a minimum horizontal distance between centers of two horizontally adjacent solder bumps in the Xs2 right columns.

20. The touch panel device of claim 8, wherein a minimum vertical distance between centers of two vertically adjacent solder bumps in the Ys1 top rows is equal to a minimum vertical distance between centers of two vertically adjacent solder bumps in the Ys2 bottom rows.

* * * * *